United States Patent [19]

Wendell

[11] Patent Number: 5,036,224
[45] Date of Patent: Jul. 30, 1991

[54] SINGLE ENDED MOS TO ECL OUTPUT BUFFER

[75] Inventor: Dennis L. Wendell, Puyallup, Wash.

[73] Assignee: National Semiconductor Corporation, Santa Clara, Calif.

[21] Appl. No.: 487,453

[22] Filed: Mar. 1, 1990

[51] Int. Cl.[5] .................. H03K 19/092; H03K 19/094
[52] U.S. Cl. ..................................... 307/475; 307/446; 307/264; 307/443
[58] Field of Search ............ 307/475, 446, 451, 296.6, 307/443

[56] References Cited

U.S. PATENT DOCUMENTS

| | | | |
|---|---|---|---|
| 4,533,842 | 8/1985 | Yang et al. | 307/296.6 |
| 4,704,549 | 11/1987 | Sanwo et al. | 307/264 |
| 4,782,251 | 11/1988 | Tsugaru et al. | 307/475 |
| 4,890,019 | 12/1989 | Hoyte et al. | 307/475 |
| 4,947,061 | 8/1990 | Metz et al. | 307/475 |

*Primary Examiner*—Stanley D. Miller
*Assistant Examiner*—Scott A. Ouellette
*Attorney, Agent, or Firm*—Limbach, Limbach & Sutton

[57] ABSTRACT

An output buffer circuit which converts CMOS logic levels to ECL logic levels. ECL high and ECL low level voltage signals are generated by a reference network. A switch responds to the status of a pair of complementary CMOS inputs to selectively connect one of the ECL voltage signals to an ECL load.

1 Claim, 2 Drawing Sheets

SINGLE ENDED MOS TO ECL OUTPUT BUFFER

BACKGROUND OF THE INVENTION

1. Field of the Invention

The present invention relates to output buffer circuitry and, more particularly, to an output buffer circuit for converting complementary metal-oxide-semiconductor (CMOS) signal levels to emitter coupled logic (ECL) signal levels for driving the inputs of ECL gates.

2. Discussion of the Prior Art

Because of the increased speed and performance which result from ECL-based systems, the use of emitter-coupled logic in digital systems has continued to expand and is now quite common. The increased speed of ECL-based systems results from the fact that ECL gates inherently operate in a non-saturation state. Thus, the propagation delay of a typical ECL gate is low in comparison with other conventional integrated circuit transistor technologies. ECL-based systems also offer the advantages of superior analog performance and greater current drive per area. However, ECL gates typically exhibit relatively high power dissipation and a small noise margin.

On the other hand, while metal-oxide-semiconductor (MOS) circuit configurations do not typically exhibit the speed of ECL-based systems, there are a number of important advantages associated with MOS technology: MOS circuits may be designed with a high packing density that allows more circuit elements to be placed in a given chip area; thus, large, complex functions may be integrated in MOS-based systems. Simple and economical process techniques may be used for fabricating MOS integrated circuits (IC's). MOS circuits consume less power than bipolar circuits. MOS systems exhibit large noise margins and noise immunity.

In particular, complementary MOS (CMOS) circuits, which employ a symmetrical combination of n-type and p-type MOS transistors, have become extremely popular for low power dissipation applications.

Thus, it is desirable to integrate the speed of bipolar ECL logic with the practicality of MOS design for certain applications.

Mixed bipolar-MOS integrated circuit technology, commonly designated as BiMOS or BiCMOS, is well known in the art. See B. Cole, "Mixed-Process Chips are about to Hit the Big Time," Electronics, Vol. 59, No. 9, Mar. 3, 1986, p. 27. BiCMOS technology permits greater packing density, utilizes gates that operate at CMOS levels, and exhibits speeds that are becoming comparable to those of ECL-based systems.

Recent developments in integrated circuit fabrication technology have made it economically feasible to obtain the advantages of both ECL and CMOS technologies in a single circuit structure. Thus, high-performance BiCMOS structures are used in a variety of high density circuit applications such as, for example, static random access memory (SRAM). See, for example, R. A. Kertis et al, "A 12-ns ECL I/O 256K×1-bit SRAM Using a 1-μm BiCMOS Technology," IEEE Journal of Solid-State Circuits, Vol. 23, No. 5, October, 1988.

In a typical BiCMOS SRAM chip configuration, CMOS to low voltage level translation is inherent in the structure of the memory cell circuitry. The transistors in the memory cells produce output levels which are lower than those required for ECL operation. As described by Kertis et al., bipolar sense amplifiers are used to detect the low level output voltage and amplify it to ECL levels.

It would be desirable, however, to have available a translator circuit which converted CMOS levels to ECL levels for connection to external devices or for internal chip translation.

SUMMARY OF THE INVENTION

The present invention provides an output buffer circuit which converts CMOS logic levels to ECL logic levels. The output buffer circuit includes means for establishing ECL high and ECL low level voltage signals and a switch that responds to the status of complementary CMOS input signals for selectively providing one of the ECL signals as its output.

In the disclosed embodiment, the switch comprises a set of four P-channel MOS (PMOS) transistors. Two of the PMOS switches connect the ECL low level signal to the output when a first CMOS input is low. When the first CMOS input goes high, and thus the second CMQS input goes low, the first pair of PMOS switches turn off, and a second pair of PMOS switches turn on, thus connecting the ECL high level signal to the output. An additional bipolar transistor is included in the switch to assist the PMOS switches in pulling the output from the low state to the high state, resulting in faster rise times.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
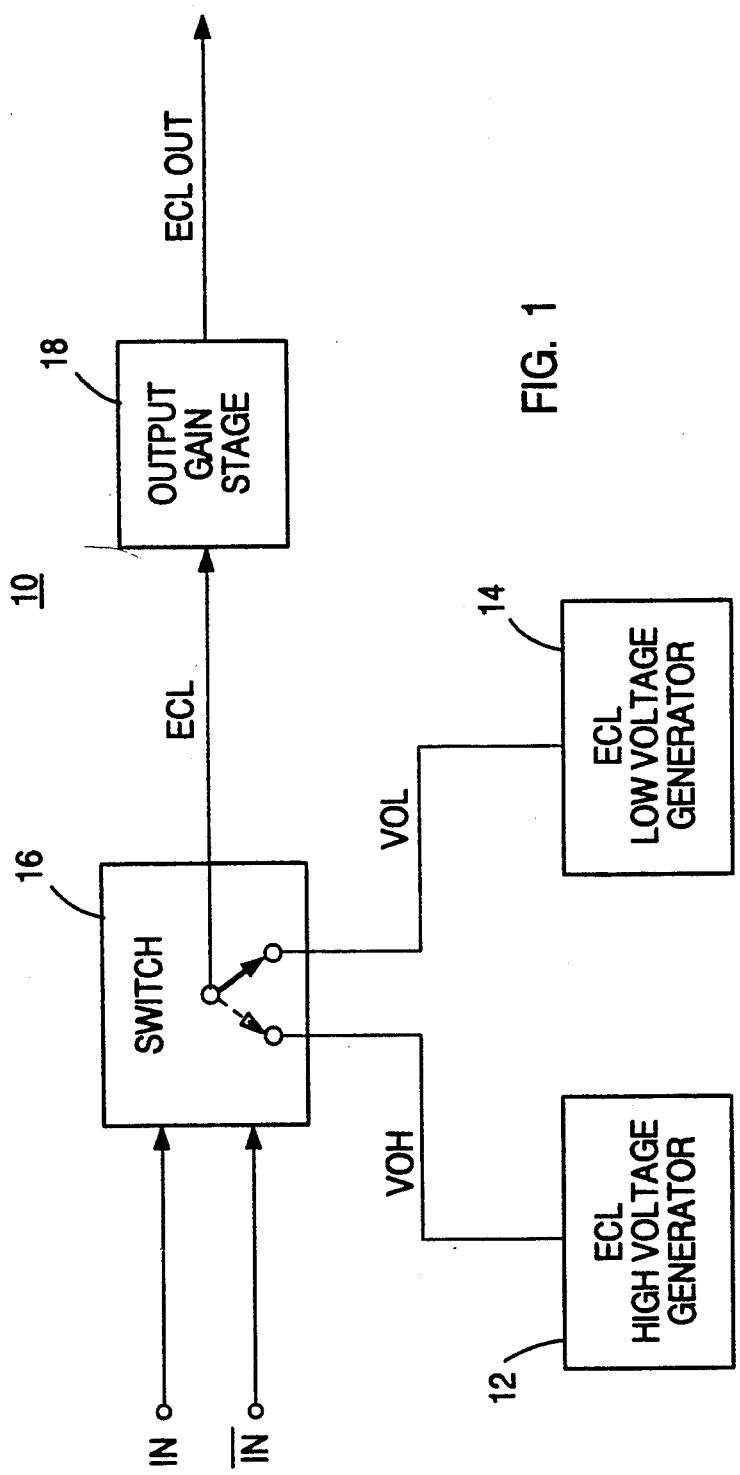
FIG. 1 is a block diagram illustrating an output buffer circuit in accordance with the present invention.

FIG. 1 shows a simple block diagram of an output buffer circuit 10 for converting complementary CMOS level input signals (IN and $\overline{IN}$) to an ECL level output signal (ECL). The output buffer circuit 10 includes an ECL high voltage generator 12 for generating an ECL high voltage level signal (VOH) and an ECL low voltage generator 14 for generating an ECL low voltage level signal (VOL). A switch 16 selectively provides either the ECL high voltage level signal (VOH) or the ECL low voltage level signal (VOL) as the ECL level output signal (ECL) depending on the logic state of the complementary CMOS level input signals IN and $\overline{IN}$. (In the FIG. 2 embodiment of the invention described below, there is a $1V_{BE}$ voltage shift between the ECL high (VOH)/ECL low (VOL) nodes and the ECL level output signal.) The output buffer circuit 10 shown in FIG. 1 also includes an output gain stage 18 for providing gain to the ECL level output signal (ECL) to provide the circuit 10 output (ECL OUT).

Figure 2:
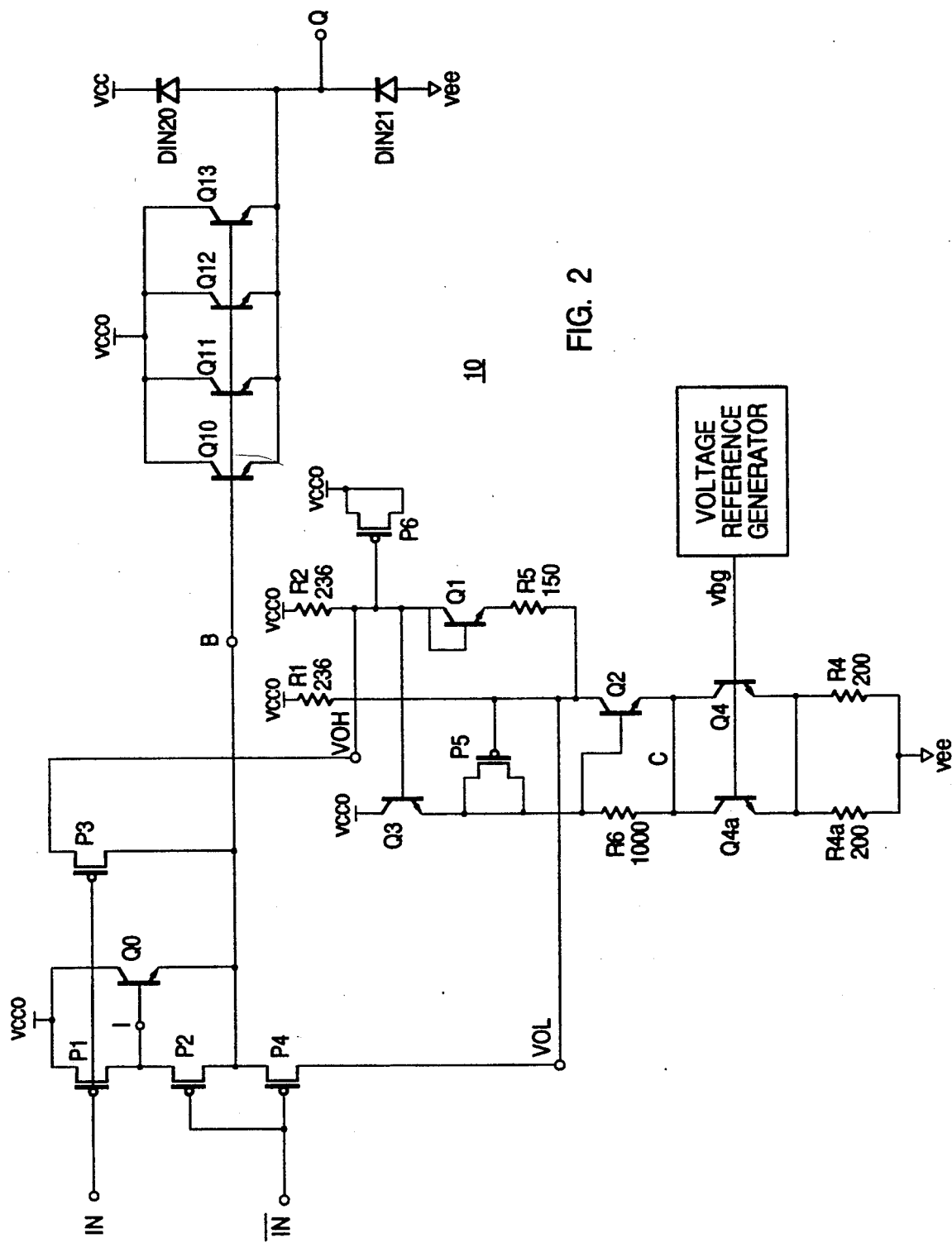
FIG. 2 is a schematic diagram illustrating an output buffer circuit in accordance with the present invention.

FIG. 2 shows a schematic diagram of an output buffer circuit 10 in accordance with the present invention.

The circuit 10 shown in FIG. 2 includes npn transistor Q2, the base of which is biased to an ECL high level voltage by the combination of npn transistor Q3 and 1kΩ resistor R6. The base of transistor Q3 is biased by the ECL high level voltage at node VOH, which is developed by the drop in voltage from $V_{cc}$ (grounded at board level) across 236Ω resistor R2. This is convenient since the voltage at node VOH is temperature compensated to 100K ECL levels by the combination of diode-connected npn transistor Q1 and 150Ω resistor R5 such that at higher temperatures transistor Q1 conducts more, and at lower temperatures transistor Q1 conducts less.

The ECL low level voltage at node VOL is developed by the voltage drop from $V_{cc}$ (ground at board level) through resistor R1 and the current through transistor Q2.

A standard temperature (approx. 0°-85° C.) and supply (−4.5 to −5.2V) invariant voltage reference $V_{bg}$ is used to derive a current through transistors Q4 and Q4A and their respective 200Ω resistors R4 and R4a. The power supply voltage $V_{ee}$ is the most negative reference in the circuit, usually about −4.5 to −5.2V. The voltage reference $V_{bg}$ is constant as a function of voltage and temperature and is set at 1.26V above $V_{ee}$.

It will be understood by those skilled in the art that the voltages at nodes VOH and VOL are $1V_{BE}$ closer to $V_{cc}$ than are the output ECL high and low voltages, respectively.

In accordance with the present invention, four PMOS transistors P1 through P4 operate as switches to connect the appropriate ECL level, i.e., VOH or VOL, to the output circuitry based on the status of the complementary CMOS input signals IN and $\overline{IN}$.

Since the inputs IN and $\overline{IN}$ are complementary, only one of them is "on" at any one quiescent moment in time. During transition from one logic state to the other, the switches P3 and P4 will be connected in mutually "on" states of variable conductivity depending on the drive levels IN and $\overline{IN}$ and the level at node B. The output current level at node B is supplied by one of the switches P3 or P4 at the level established by voltage VOL (from P3) or voltage VOH (from P4), as generated above, and required by the emitter load reduced by the current gain of the output gain stage transistors Q10–Q13 (described below). With approximately equal rise and fall times of the complementary inputs IN and $\overline{IN}$, the self-generated capacitive coupling $C_{gs}$, $C_{gd}$ of MOSFET switch P1-P4 is about equal, eliminating undesired transient output levels.

The network comprising npn transistor Q0 and PMOS transistors P1 and P2 is used to improve the response of the output driving to the high state. Initially, i.e. IN=0 and $\overline{IN}$=1 (where 1=$V_{cc}$ and 0=$V_{ee}$), switches P2 and P4 are on, transistor Q0 is off, and node B is connected to the VOL level through switch P4. Changing the status of the input levels (IN=1 and $\overline{IN}$=0) results in switches P1 and P3 turning on and switches P2 and P4 turning off. The base/emitter drive to transistor Q0 is, therefore, approximately one diode drop ($V_{BE}$). This assists switching transistor P3 in bringing node B to the VOH level. Since the collector current of transistor Q0 is exponentially dependent on voltage $V_{BE}$, which is the difference between node I and node B, transistor Q0 shuts off as node B tends toward the VOH level. Thus, the network of transistors Q0, P1 and P2 serves to aid the risetime only in the initial transition of node B from VOL to VOH. In the quiescent state, transistor Q0 is off.

For the high to low state transition, the network of transistors Q0, P1 and P2 described above is turned off, and switch P4 is turned on. Transistor Q2 sinks current to ECL low state VOL through switch P4, connected to the base of output gain stage Q10–Q13.

The output gain stage circuitry consists of npn transistors Q10 through Q13 connected in an emitter-follower configuration, resulting in an output signal at node Q suitable for ECL loads.

The output buffer circuit described above uses approximately the same power dissipation which would be consumed in a standard ECL current switch and emitter follower combination.

Since voltage reference $v_{bg}$ is not locally generated, a reference generator is required. The output levels are similar to that of standard ECL gates, but additional control is provided by not requiring resistor R1 to equal resistor R2, as would be required for symmetrical switching in the standard ECL world. Therefore, resistor R1 can be adjusted locally, i.e., on chip, for each output buffer position to control the ECL low level voltage VOL. Resistor R2 is used similarly to obtain adjustment of the ECL high level voltage VOH.

Transistors P5 and P6 provide transient filter and noise suppression.

Diodes D1 and D2 are output protection electrostatic discharge diodes.

It should be understood that the invention is not intended to be limited by the specifics of the above-described embodiment, but rather defined by the accompanying claims.

I claim:

1. An output buffer circuit for converting first and second complementary CMOS level input signals to an ECL level output signal, the circuit comprising:

(a) first ECL means for generating an ECL high voltage level signal;

(b) second ECL means for generating an ECL low voltage level signal;

(c) an output gain stage responsive to the output of the switching means for providing gain to the ECL level output signal;

(d) a npn transistor;

(e) a first PMOS transistor having its gate connected to receive said first complementary CMOS level input signal, its drain connected to receive the ECL low level voltage signal, and its source connected to the output gain stage, such that said first PMOS transistor turns on when said first complementary CMOS level input signal is low, thereby effectively connecting said ECL low level voltage to said output gain stage;

(f) a second PMOS transistor having its gate connected to receive said second complementary CMOS level input signal, its source connected to receive said ECL high level voltage, and its drain connected to the output gain stage, such that said second PMOS transistor turns on when said second complementary CMOS level input signal goes low thereby effectively connecting said ECL high level voltage to said output gain stage;

(g) a third PMOS transistor having its gate connected to receive said first complementary CMOS level input signal, its drain connected to the output gain stage, and its source connected to the base of said npn transistor, such that said third PMOS transistor turns on when said first complementary CMOS level input signal is slow thereby inhibiting said npn transistor from conducting; and (h) a fourth PMOS transistor having its gate connected to receive said second complementary CMOS level input signal, its drain connected to the base of said npn transistor, and its source commonly connected to both the collector of said npn transistor and a first reference voltage, such that said fourth PMOS transistor turns on when said second complementary CMOS level input signal goes low, such that said npn transistor conducts and shortens the rise time needed for said output gain stage to transition from said ECL low level voltage to said ECL high level voltage.

* * * * *